(12) United States Patent
Salmon et al.

(10) Patent No.: US 6,885,959 B2
(45) Date of Patent: Apr. 26, 2005

(54) CIRCUIT AND METHOD FOR CALIBRATING DRAM PULLUP RON TO PULLDOWN RON

(75) Inventors: Joseph H. Salmon, Placerville, CA (US); Hing Y. To, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 10/282,798

(22) Filed: Oct. 29, 2002

(65) Prior Publication Data

US 2004/0083070 A1 Apr. 29, 2004

(51) Int. Cl.$^7$ ................................................ G06F 3/05
(52) U.S. Cl. ....................... 702/107; 702/116; 702/182; 702/183
(58) Field of Search ........................ 702/90, 106, 107, 702/117, 120, 121; 365/201; 257/686; 710/305; 709/219

(56) References Cited

U.S. PATENT DOCUMENTS

| | | | |
|---|---|---|---|
| 6,356,106 B1 | * | 3/2002 | Greeff et al. ............... 326/30 |
| 6,445,316 B1 | * | 9/2002 | Hsu et al. .................. 341/120 |
| 2003/0184343 A1 | * | 10/2003 | Kuge ......................... 326/86 |
| 2003/0223303 A1 | * | 12/2003 | Lamb et al. ........... 365/230.06 |

* cited by examiner

*Primary Examiner*—Marc S. Hoff
*Assistant Examiner*—Felix Suarez
(74) *Attorney, Agent, or Firm*—Pillsbury Winthrop LLP

(57) ABSTRACT

Embodiments of the present invention enable the matching of pull-up and pull-down driver strengths of a slave device (DDRII SDRAM), i.e., the P-channel/N-channel driver pull-up/pull-down Ron and also calibrates the P-channel/N-channel pull-up/pull-down drivers in their linear region of operation. Specifically, embodiments of the present invention may use the DDR-II Off Chip Driver (OCD) protocol for calibration, in addition to using circuit techniques to calibrate the slave driver pull-up Ron within 1 LSB of the pull-down Ron.

44 Claims, 8 Drawing Sheets

| A9 | A8 | A7 | Operation |
|---|---|---|---|
| 0 | 0 | 0 | OCD calibration mode exit |
| 0 | 0 | 1 | Drive(1) DQ, DQS, (RDQS) high and DQS low |
| 0 | 1 | 0 | Drive(0) DQ, DQS, (RDQS) low and DQS high |
| 1 | 0 | 0 | Adjust mode |
| 1 | 1 | 1 | OCD calibration default |

Figure 5

| 4bit burst code inputs to all DQs | | | | Operation | |
|---|---|---|---|---|---|
| $D_{T0}$ | $D_{T1}$ | $D_{T2}$ | $D_{T3}$ | Pull-up driver strength | Pull-down driver strength |
| 0 | 0 | 0 | 0 | NOP (No operation) | NOP (No operation) |
| 0 | 0 | 0 | 1 | Increase by 1 step | NOP |
| 0 | 0 | 1 | 0 | Decrease by 1 step | NOP |
| 0 | 1 | 0 | 0 | NOP | Increase by 1 step |
| 1 | 0 | 0 | 0 | NOP | Decrease by 1 step |
| 0 | 1 | 0 | 1 | Increase by 1 step | Increase by 1 step |
| 0 | 1 | 1 | 0 | Decrease by 1 step | Increase by 1 step |
| 1 | 0 | 0 | 1 | Increase by 1 step | Decrease by 1 step |
| 1 | 0 | 1 | 0 | Decrease by 1 step | Decrease by 1 step |

CIRCUIT AND METHOD FOR CALIBRATING DRAM PULLUP RON TO PULLDOWN RON

BACKGROUND OF THE INVENTION

1. Field of the Invention

The present invention relates to a semiconductor memory device and a semiconductor memory device calibration method and, more particularly, to a double data rate synchronous dynamic random access memory (DDR SDRAM) and a calibration method therefor.

2. Discussion of the Related Art

Double Data Rate (DDR) memory devices use source synchronous transfers when data is written to or read from the memory devices. The data strobe signal (DQS) is sent along with the data (DQ) to be clocked to a memory controller. The DQS signal is edge-aligned with the DQ signal for read cycles and center-aligned with the DQ signal for write cycles.

Second generation Double Data Rate (DDR-II) devices as defined by JEDEC Solid State Technology Association Standard JESD90 conform to the Series Stub Terminated Logic for 1.8 volt operation (SSTL_1.8) signaling level standard as defined by JEDEC Standard JESD8-15. The SSTL_1.8 standard has been developed to ensure that the data signals can meet the higher data throughputs speeds needed for newer memory systems. SSTL_1.8 is optimized for the memory environment, though it can be used in other situations. The primary benefits of the SSTL_1.8 signaling method are its ability to drive many stub terminated loads, reduce signal voltage swings, ensure compatibility with newer memory products, and reduce EMI/RFI.

Referring to FIG. 1, the output buffer is essentially a standard P-channel/N-channel CMOS driver 110 operating at the lower 1.8 v VDDQ 120. The key difference of the SSTL_1.8 circuits is the use of a reference voltage VREF 102 that serves as an input to a reference potential input terminal of a typical input receiver 100. VREF 102 provides a reference for determining whether an input signal is a high level signal or a low level signal. The typical input receiver 100 includes a differential pair common source amplifier. One input to the differential amplifier is the incoming data signal 101 and the other input is the reference voltage VREF 102. The reference voltage 102 is shared between all memory devices and a memory controller. This type of receiver has the advantage of rejecting common mode noise while providing better gain, higher bandwidth, and a reducing threshold offset due to proximity and size of the transistor differential pair as compared to the standard transistor-transistor logic (TTL) type of receiver. This results in improved signal swing sensitivity and reliability, and also higher operating speeds.

The SSTL_1.8 signaling standard is built upon the idea of transmitting data at a different level versus the older logic level swing. The standard has the data bit swinging around the midpoint of the data bus's supply level. Because the data signals are single ended the reference voltage must track the midpoint of the signal transitions. VREF must be kept within 2% of the midpoint of the signal voltage swing. To consume reasonable power, high frequency signaling requires small amplitude signals. For a receiver to detect small voltage swings e.g., 0.5 volts easily in a noisy environment, the current must also be very large (e.g., on the order of 50 to 60 milliamps per driver). With this differential structure, the difference between $V_{IH}$ and $V_{IL}$ may be 0.5 volts (0.25 volts from the midpoint) vs. the 1.2 volt swing ($V_{IH}$=2.0 volts and $V_{IL}$=0.8 volts) found on LVTTL (Low Voltage TTL). VREF is defined as 0.5 of VDDQ (bus supply), and $V_{SSQ}$ is at ground. VREF must track VDDQ in order to ensure proper detection by the input receivers.

The VREF signal is a high impedance DC voltage reference generated from, and which tracks with, the power supply over time, but cannot respond to instantaneous noise. Usually, the DC value of the power supply varies by five percent (5%). FIG. 2 is a timing diagram illustrating an example signal 201 relative to a VREF 102, high reference voltage ($VREF_H$) 203 and a low reference voltage ($VREF_L$) 204. The $VREF_H$ 203 and $VREF_L$ 204 values typically depend on power supply variation used to generate the VREF 102 signal. The large voltage swing, i.e., the difference between a high voltage signal (VIH) 210 and a low voltage signal (VIL) 211, and stable signal levels above and below the VREF 102 signal are required for reliable detection of signal state. The DDR-II volatage swing is approximately 1.2 volts.

In order to achieve a data signal that swings symmetrically around 0.5 of VDDQ, the pull-up and pull-down Ron resistance of the P-channel/N-channel drivers must be closely matched through a calibration procedure. The P-channel/N-channel CMOS driver actually consists of a number of parallel P-channel pull-up "legs" and a number of parallel N-channel pull-down "legs". The pull-up or pull-down Ron resistance is inversely proportional to the driver strength, i.e., the number of parallel driver legs that are driven on. In addition, the calibration of the pull-up and pull-down Ron resistance of the P-channel/N-channel drivers should be made with the drivers operating in their linear region.

Therefore, what is needed is a calibration procedure that matches the P-channel/N-channel pull-up/pull-down Ron and also calibrates the P-channel/N-channel pull-up/pull-down drivers in their linear region of operation.

BRIEF DESCRIPTION OF THE DRAWINGS

FIG. 5 illustrates a chart describing the Off Chip Driver (OCD) mode operations according to an embodiment of the present invention;

FIG. 6 illustrates a chart describing the OCD mode 4 bit burst code according to an embodiment of the present invention;

DETAILED DESCRIPTION

Figure 3A:
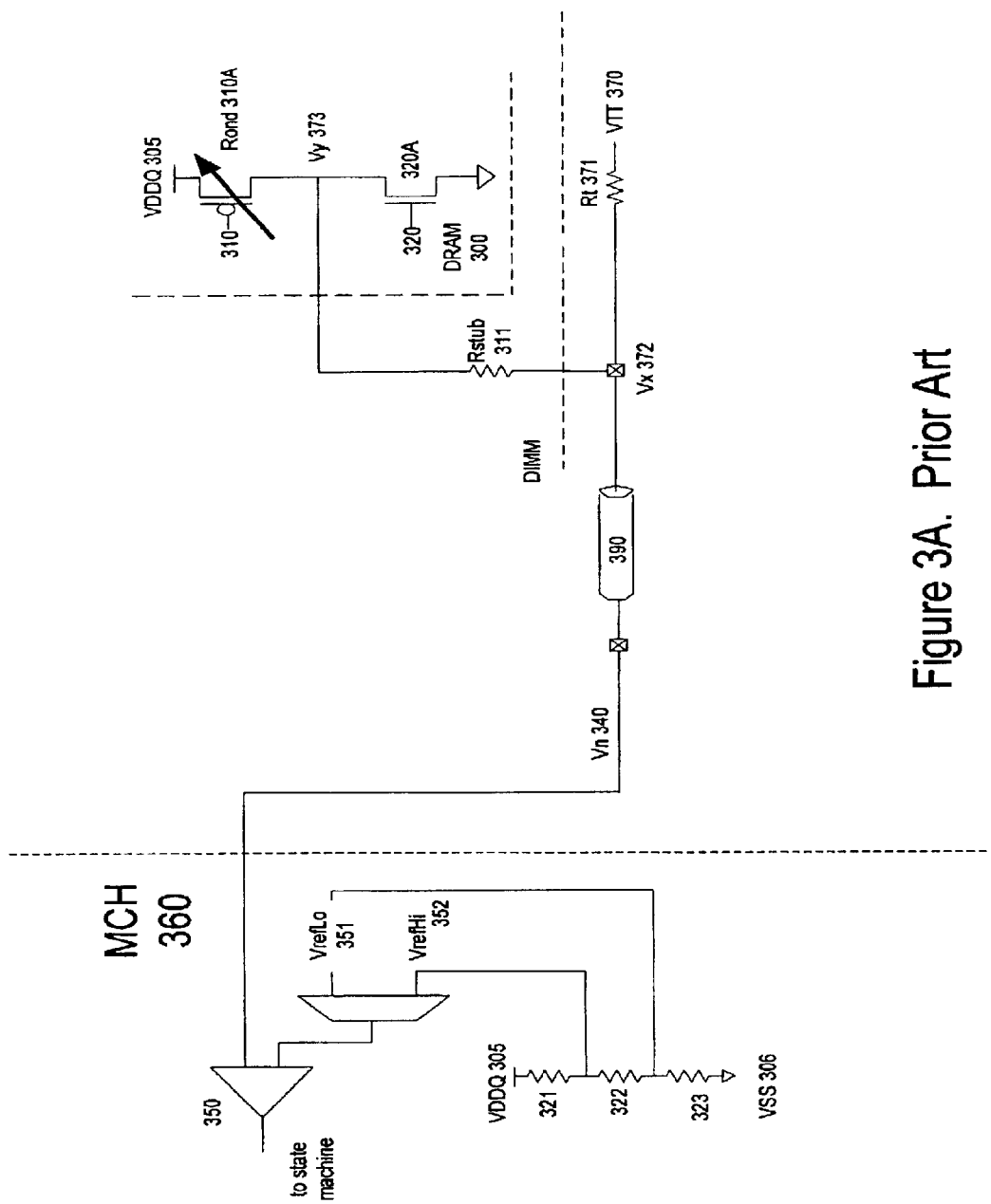
FIG. 3A illustrates a prior art DDR-II method of calibrating a SDRAM P driver at a Memory Control Hub.

Existing DDR resistor compensation circuits (Rcomp) typically calibrate the P-channel/N-channel CMOS pull-up/ pull-down drivers at approximately 0.3V (DDR-II) or 0.5V (DDR-I) from each driver rail (VDDQ, VSSQ). Referring to FIG. 3A, a reference voltage VrefHi 352 is generated for the P driver 310 calibration and a reference voltage VrefLo 351 is generated for the N driver 320 calibration. VrefHi 352 and VrefLo 351 may be generated by a three matched resistor 321, 322, 323 voltage divider that is tied to the supply voltage VDDQ 305. For DDR-II the VDDQ voltage 305 is 1.8 volts, therefore ideally VrefHi 352 will equal ⅔ VDDQ or 1.2 volts, and VrefLo 351 will equal ⅓ VDDQ or 0.6 volts.

Figure 1:
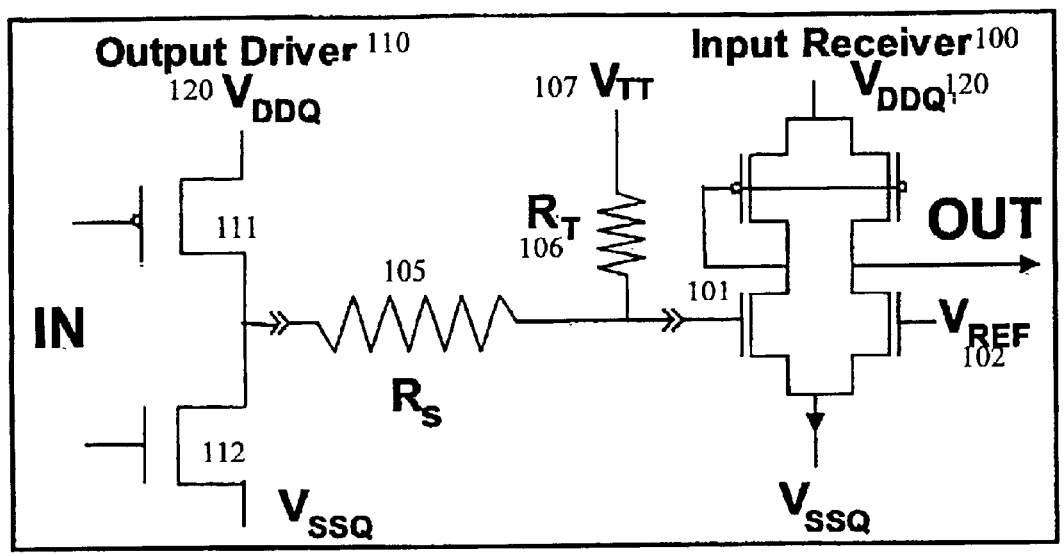
FIG. 1 illustrates a prior art SSTL_1.8 Receiver and Driver.
Figure 2:
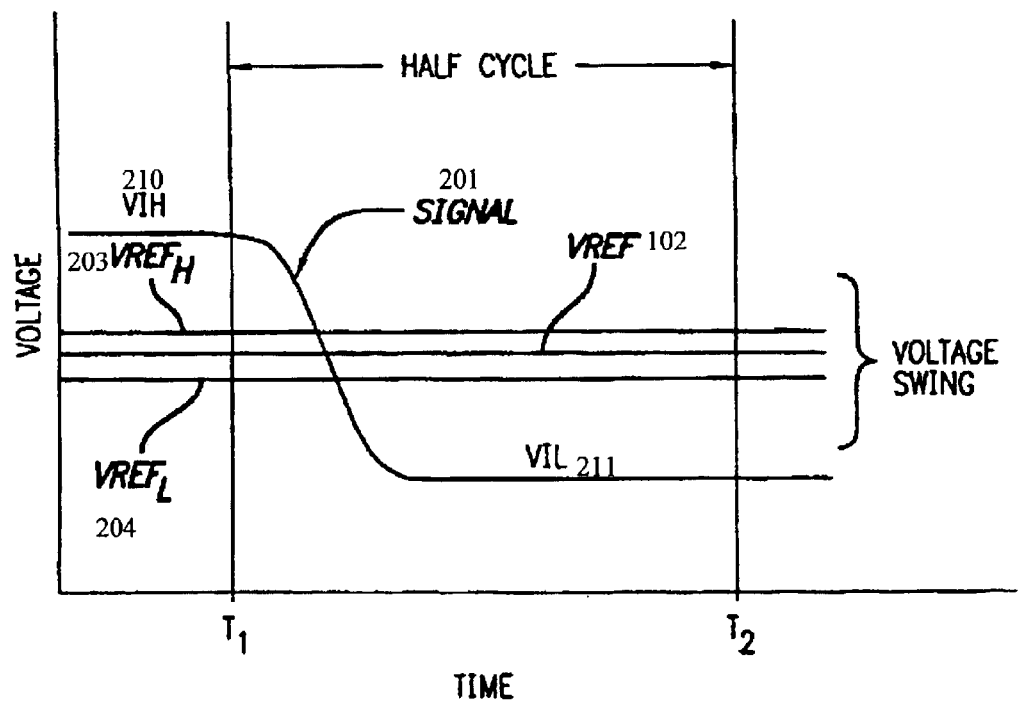
FIG. 2 is a prior art signal level diagram illustrating an example signal relative to a reference voltage.

Due to the rapid data transfer rate, proper termination of the data signal lines DQ is critical for proper operation. One implementation of DDR-II SDRAM implements a motherboard series-parallel termination topology (see FIG. 1 where the output driver 110 is a DRAM driver and Rs 105 is a stub resistor Rstub). This method uses only one series resistor 105 and one parallel terminating resistor 106 tied to the termination voltage supply (VTT) line 107. The use of series-parallel termination is useful for high-speed signaling because it allows the bus transmission line to be properly electrically terminated. This results in reduced signal reflection, reduced settling times, lower EMI emissions, and generally higher clock rates.

Referring to FIG. 3A, this termination scheme uses a minimum parallel resistance, Rt 371, between 20 and 28 ohms, located on the motherboard and tied to VTT 370. This termination design complies with the minimum output voltage and output currents of the SSTL_1.8 specification. The series terminating resistor, Rstub 311, resides on the dual in-line memory module (DIMM) and will fall in the range of 10 to 30 ohms, typically 22 ohms.

The general loaded characteristic impedance of a non-specific bus environment is on the order of 40 ohms and is dependent upon the amount and type of memory devices, physical signal layout, and characteristics of the board materials. Generally, an equivalent 25 ohm parallel terminating resistor 371 has been specified by memory device manufacturers as a good first pass value. This resistor will provide a good match for the loaded impedance, terminating reflected signals within one round trip. The parallel terminating resistor 371 should be placed beyond the last memory device on the memory bus. This resistor will help cancel out the reflections The pull-up or pull-down Ron driver resistance is inversely proportional to the driver strength, i.e., the number of parallel driver legs that are driven on. A memory controller hub (MCH) 360 provides an Off Chip Driver (OCD) command that varies the pull-up or pull-down strength of a DRAM driver against a known load until the voltage at node Vn 340, when compared by comparator 350 to the reference voltage, VrefHi 352 or VrefLo 351, signifies a pass condition, i.e., toggles the comparator 350.

A problem associated with this method is that since the P driver 310 is calibrated against one reference (VrefHi 352) and the N driver 320 is calibrated against another reference (VrefLo 351), a reference error may be generated wherein both VrefHi 352 and VrefLo 351 will vary as a function of the resistor 321, 322, 323 tolerances. Some processes do not feature a precision resistor, therefore, larger than desired resistor tolerances may have to be taken in to account. This error may cause more than 1 least significant bit (LSB) error (the maximum step size of the DRAM driver).

The following three examples are given to illustrate this point. Referring to the matched three resistor voltage divider in FIG. 3A with VDDQ=1.8 volts, VTT=½ of VDDQ=0.9 volts, VSS=ground.

$VrefHi = (VDDQ-VSS)*(R323+R322)/(R321+R322+R323)$ $VrefLo = (VDDQ-VSS)*(R323)/(R321+R322+R323)$ For the ideal case with R321=R322=R323

$VrefHi = ⅔ VDDQ = 1.2$ volts $VrefLo = ⅓ VDDQ = 0.6$ volts

For illustrative purposes assume the initial target resistances are Ron 310A=18 ohms, Rstub 310=22 ohms, and Rt=20 ohms yielding Ron+Rstub=40 ohms to match to the 40 ohm motherboard transmission line. VTT=½ of VDDQ. The voltage at node Vn 340 equals the voltage at node Vx 372 equals VTT+VRt, and the voltage VRon(Vsd) will equal VDDQ−Vy 373:

$VRt = Rt/(Ron+Rstub+Rt)*(VDDQ-VTT)$ $VRt = 20/(18+22+20)*(1.8-0.9) = 0.30$ $Vn = Vx = 0.9+0.30 = 1.20$ $Vy = 0.9+((Rstub+Rt)/(Ron+Rstub+Rt)*(VDDQ-VTT))$ $Vy = 0.9+((22+20)/(18+22+20)*(1.8-0.9)) = 1.53$ $VRon(Vsd) = 1.8-1.53 = 0.27$ (approximately 0.3 volts)

Case 1, assume a 5% error on resistor tolerances that may be representative of an ASIC process. For example, assuming a 20 ohm resistor and the value of R321 is −2.5% low, R322 is −2.5% low and the value of R323 is +2.5% high. Furthermore, treat Rstub=22 ohms and Rt=20 ohms as ideal.

$VrefHi = (R323+R322)/(R321+R322+R323)*(VDDQ-VSS)$ $VrefHi = [(20.5+19.5)/(20.5+19.5+19.5)]*VDDQ = 1.21V$ $VrefLo = (R323)/(R321+R322+R323)*(VDDQ-VSS)*$ $VrefLo = [20.5/(20.5+19.5+19.5)]*VDDQ = 0.62V$ Calculating the Calibration error gives:

$Vn = VrefHi$ $Ical = (Vn-Vtt)/Rt = (1.21-0.9)/20 = 15.5$ mA $Vy = Ical*(Rt+Rstub) = 16*(20+22)+Vtt = 1.55V$ $Vds = VDDQ-Vy = 1.8-1.55 = 0.25$ $RonP = Vds/Ical = 0.25/0.0155 = 16.1$ ohm vs. a target of 18 ohms.

So, the calibration error term is 11% for the P driver.

Calculating the N driver error:

$Vn = VrefLo$ $Ical = (Vtt-Vt)/Rt = (0.9-0.62)/20 = 14$ mA $Vy = Ical*(Rt+Rstub) = 14*(20+22) = 0.312V$ $RonN = 0.312/0.014 = 22.28$ ohm vs. a target of 18 ohms.

Resultant N driver calibration error term is 23%.

As shown above, the tolerances of the resistors may lead to error in establishing VrefHi and VrefLo compared to the ideal case. This will lead to an absolute error in the calibration of the driver on resistance Ron of the pull-up driver 310 and Ron of the pull-down driver 320, and an error in matching the pull-up driver to the pull-down driver.

Embodiments of the present invention are directed primarily to matching of the pull-up driver to the pull-down driver.

Additionally, the termination voltage VTT 370 may introduce an error term in the calibration of the pull-up and pull-down drivers. VTT 370 should be equal to ½ of VDDQ. However, VTT will vary independently of VrefHi or VrefLo and introduce error. VTT may be defined to be within 40 mV of the overall bus, memory, and controller reference voltage, VREF. Exceeding the 40 mV range will shift the midpoint reference voltage enough to indicate false valid signal levels. Usually the same supply is used to source both the reference and termination voltages. Ideally, both of these voltages must track variations in VDDQ–VSSQ over the environmental variations encountered during operation and maintain symmetry with respect to $V_{OH}$ and $V_{OL}$.

Another prior art calibration method used is to calibrate one driver (P or N) against a known load at VDDQ/2 (generated by a two matched resistor divider) and then use this as a load for the opposite driver at the same comparison voltage. The problem with this calibration procedure is that neither driver is calibrated at its spec point (i.e., for linear operation at approximately 0.3V or 0.5V from each rail), rather, the drivers will be calibrated at the non-linear knee portion of the IV curve and the IV curve translation from VDDQ/2 to 0.3 or 0.5V from each rail may not provide the desired correlation.

Embodiments of the present invention enable the matching of pull-up and pull-down driver strengths of a slave device (DDRII SDRAM), i.e., the P-channel/N-channel driver pull-up/pull-down Ron and also matches the P-channel/N-channel pull-up/pull-down drivers in their linear region of operation. Specifically, embodiments of the present invention may use the DDR-II Off Chip Driver (OCD) protocol for calibration, in addition to using circuit techniques to calibrate the slave driver pull-up Ron within 1 LSB of the pull-down Ron.

DDR-II SDRAM supports this driver calibration feature. OCD impedance adjustment can be done using a DDR-II SDRAM Extended Mode Register Set (EMRS). The Extended Mode Register controls functions beyond those controlled by the Mode Register. These additional functions include OCD calibration mode exit, Drive output high mode (Drive (1)), Drive output low mode (Drive (0)), Adjust mode, and OCD calibration default. These functions are controlled via the 3 bit patterns shown in FIG. 5. For example, a bit sequence of 100 sent from the MCH 360 to the EMRS in the DDR-II SDRAM 300 corresponds to the Adjust impedance mode.

The Mode Register is used to define the specific mode of operation of the DDR-II SDRAM. The Mode Register is programmed via the MODE REGISTER SET command and will retain the stored information until it is programmed again or the device loses power. The Extended Mode Register is programmed via the MODE REGISTER SET command and will also retain the stored information until it is programmed again or the device loses power. The Extended Mode Register must be loaded when all banks are idle and no bursts are in progress, and the MCH 360 must wait the specified time before initiating any subsequent operation.

Memory controllers (MCH 360) use both drive modes, Drive(1) and Drive(0), to measure DDR-II SDRAM driver impedance before and after the OCD impedance adjustment. In this mode, all outputs are driven out after an "enter drive mode" command and all output drivers are turned-off after an "OCD calibration mode exit" command.

OCD impedance adjustment may be done using an EMRS "Adjust mode" in addition to an "input operation code pattern" shown in the table of FIG. 6. The input operation code patterns consist of a 4 bit burst code that is transmitted from a memory controller (MCH 360) to a DDR-II SDRAM 300 using a data line DQ 340. The 4 bit burst code adjusts the pull-up driver 310 strength or pull-down driver 320 strength by increasing or decreasing the number of parallel driver legs one step at a time, i.e. turning on one parallel driver at a time per step.

To adjust the output driver impedance, the memory controllers may issue an "Adjust mode" command using an EMRS command first, followed by driving the 4 bit burst code information on a data line DQ to the DDR-II SDRAM. For example, the MCH 360 may first send a 100 "adjust mode" pattern to the EMRS followed by sending the 4 bit burst code 0001 to a DDR-II SDRAM 300 using a data line DQ 390 to increase the pull-up driver 310 strength by one step (turn on one additional pull-up driver leg).

The maximum step count for adjustment may be e.g., 16 and when the limit is reached, further increment or decrement has no effect. In the case of OCD calibration default, output driver characteristics follow the approximate nominal V/I curve for 18 ohm output drivers, but are not guaranteed. Default setting can be any step within the 16 step range.

When using the OCD calibration procedure, every calibration mode command should be followed by "OCD calibration mode exit" before any other command is issued. Mode Register Set (MRS) should be set before entering the OCD impedance adjustment and the On Die Termination (ODT) should be off during the calibration procedure using the motherboard termination. The ODT is a feature that allows a DDR-II SDRAM to turn on/off a termination resistance for each DQ/DQS/DQS# signal via the ODT control pin. The ODT feature is designed to improve signal integrity of the memory channel by allowing the DRAM controller to independently turn on/off termination resistance for any or all DRAM devices. For systems using the ODT, the ODT may be used as a load source and should be carefully controlled depending on the system environment. For example, the ODT system may be turned on and used as a load for DQ, DQS and DQS# calibration.

Figure 3B:
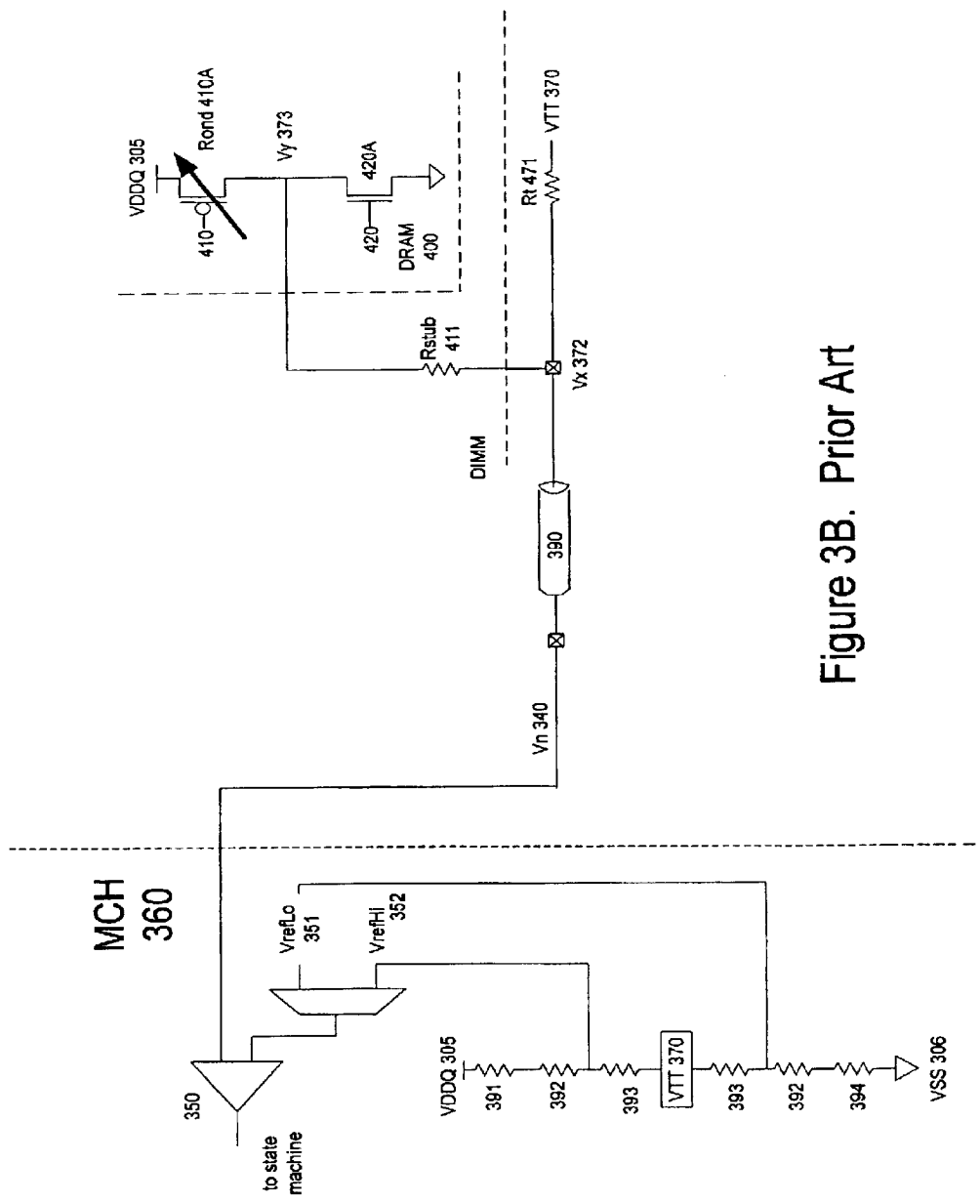
FIG. 3B illustrates a DDR-II method of calibrating a SDRAM P driver at a Memory Control Hub according to an embodiment of the present invention.

The first step in the overall calibration procedure calibrates either the N or P device at the DDR-II specification condition, i.e. approximately 0.3 volts from the supply rail. It will be appreciated that several methods are known in the art to calibrate the N or P device e.g. the absolute Ron resistance may be factory preset to approximately 18 ohms. Another method may involve using the resistive divider as shown in FIG. 3B for calibrating the P driver 410 where the resistor values RonP 391, Rstub 392, and Rt 393 are equal to the target resistances Ron 410A, Rstub 411, Rt 471. (Ron 410A is equal to the initial nominal impedance before calibration). This circuit reduces the error demonstrated in FIG. 3A by allowing VrefHi 352 to track VTT 370.

$$VrefHi = (Rt/(Ron + Rstub + Rt)) * (VDDQ - VTT)) + VTT$$

The values of, Ron 391, Rstub 392, and Rt 393 may be chosen so that VrefHi 352 (in the case of P device 410 calibration) is equal to 1.2 volts which should ensure/correspond to the P channel pull-up driver 410 operating in the linear region of the IV curve, approximately 0.3 volts from VDDQ 305 (Vsd=0.3).

Alternatively, the N-channel pull-down driver 420 may be calibrated first using the resistive divider as shown in FIG. 3B for calibrating the N driver 420 where the resistor values RonN 394, Rstub 392, and Rt 393 are equal to the target resistances Ron 420A, Rstub 411, Rt 471. (Ron 420A is equal to the initial nominal impedance before calibration).

This circuit reduces the error demonstrated in FIG. 3A by allowing VrefLo 351 to track VTT 370.

$$VrefLo=(Rstub+RonN)/(RonN+Rstub+Rt)*VTT$$

The values of, RonN 394, Rstub 392, and Rt 393 may be chosen so that VrefLo 351 (in the case of N device 420 calibration) is equal to 0.6 volts which should ensure/correspond to the N channel pull-up driver 420 operating in the linear region of the IV curve, approximately 0.3 volts from VSS 306 (Vds=0.3).

To calibrate the pull-up or pull-down drivers the pull-up or pull-down drive strength will initially default to a minimum drive strength, i.e., decrement the register strength to a minimum in order to increment the drive strength up to find a pass/fail point (alternatively you could default to a maximum drive strength, i.e. increment the register strength to a maximum in order to decrement down to find a pass/fail point).

Assuming a default to a minimum drive strength and the case of calibrating the P driver first, the P-channel pull-up driver 410 strength is then varied by turning on additional legs of the driver until the output voltage at node Vn 340 into the comparator 350 is equal to VrefHi 352 (1.2 volts), thus reaching a pass point and toggling the comparator 350. For DDR-II, the pull-up driver 410 strength can be varied by the MCH 360 signaling the SDRAM 400 using the OCD mode.

Figure 4:
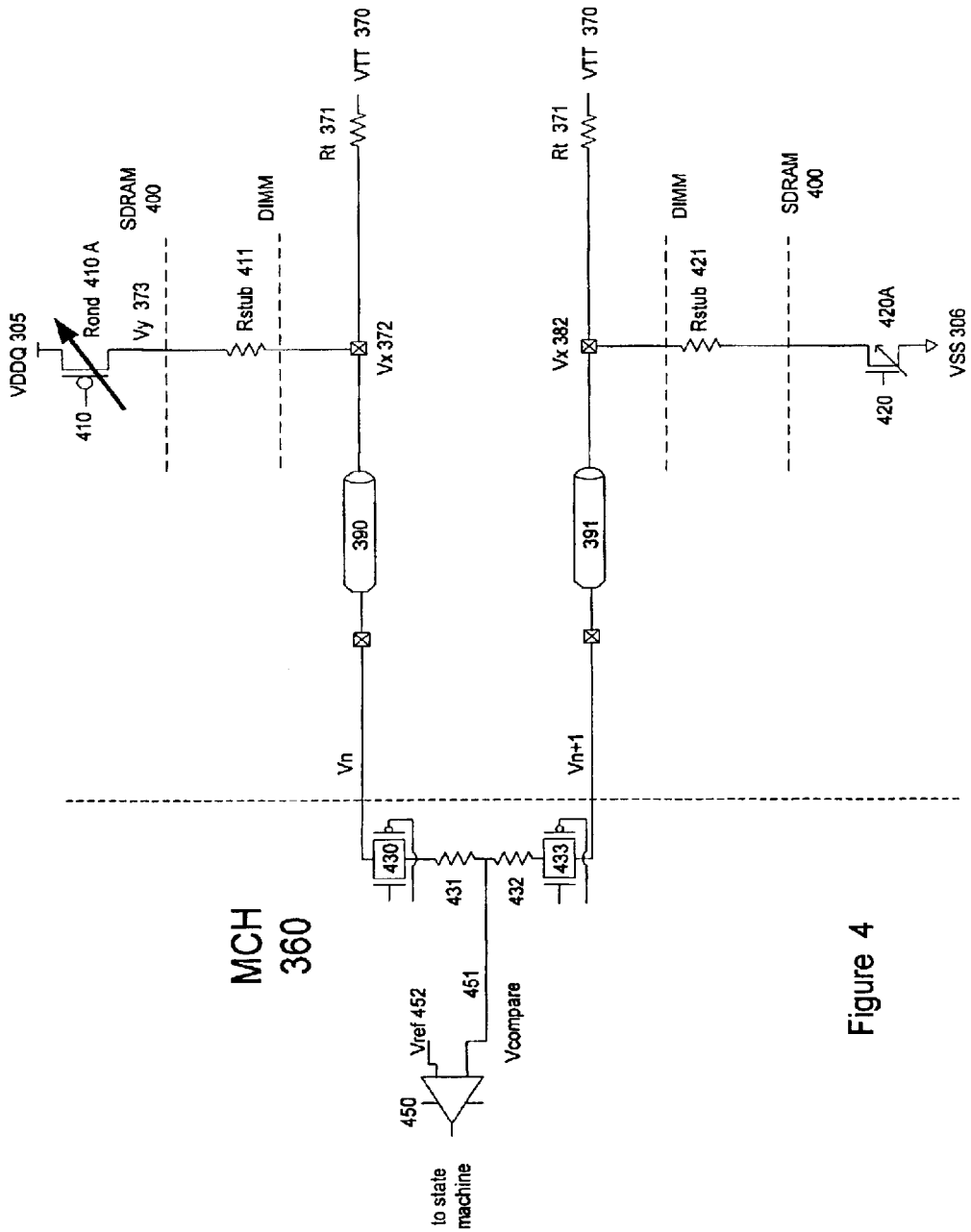
FIG. 4 illustrates a DDR-II method of calibrating a SDRAM P driver against an adjacent pin N driver according to an embodiment of the present invention.

The circuit shown in FIG. 4 illustrates the second step of the overall calibration procedure. In one embodiment of the present invention, the MCH 360 signals the DRAM 400 using the OCD mode, one driver is driven high (e.g. pullup driver 410 for pin 1 372 of the DRAM), while the driver on the adjacent pin is driven low (e.g., pulldown driver 420 for pin 2 382 of the DRAM 400). A DDR DRAM 400 may have eight data pins, each pin being connected to a P-channel/N-channel output driver. Ideally, the slave SDRAM 400 may drive one half the data pins high, e.g. odd pins, and one half the data pins low, e.g. even pins for the OCD mode. In an alternative embodiment (current DDR-II OCD mode) all outputs are driven high and sent to the MCH 360 along with the strobe signal DQS and DQS# providing true and complementary data to effectuate the same result, i.e., one pin driven high with the adjacent pin driven low.

Using the OCD calibration mode, a strobe buffer will drive one strobe high for pin 1 372 thus turning the P-channel driver 410 on (not shown is the complementary N-channel driver which is off) and one strobe low for the adjacent pin 2 382 thus turning the N-channel driver 420 on (not shown is the complementary P-channel driver which is off).

The high side signal (P-channel driver 410 on) is shorted to the low side signal (N-channel driver 420 on) via a switch in the form of a CMOS P-channel/N-channel transistors (430, 433) and resistor bridge (431, 432). The resistor bridge voltage (Vcompare 451) is compared to Vref 452 and the "un-calibrated" side (the legs of the N-channel driver 420) are incremented/decremented until the comparator 450 toggles. At this point, the P side driver Ron 410A is matched to the N side driver Ron 420A within 1 LSB and the drivers 410, 420 are driving at the specification condition (i.e., approximately 0.3 volts from the supply rails).

In further detail, when the P-channel/N-channel driver pull-up/pull-down Ron are matched, the resistances in the circuit are matched, i.e., the series resistance of the P-channel driver Ron 410A, Rstub 411, CMOS P-channel/N-channel Ron 430, Rx 431 are equal to the series resistance of the N-channel driver Ron 420A, Rstub 421, CMOS P-channel/N-channel Ron 433, Rx 432. Therefore, the voltage at the node Vcompare 451 (the resistor bridge voltage) is equal to 0.5 VDDQ. When the resistor bridge voltage Vcompare 451 is compared to Vref by comparator 450, the output of the comparator 450 toggles low (assuming pull-down driver strength was increased from min to max to increment the drive strength up to find a pass/fail point).

Figure 7:
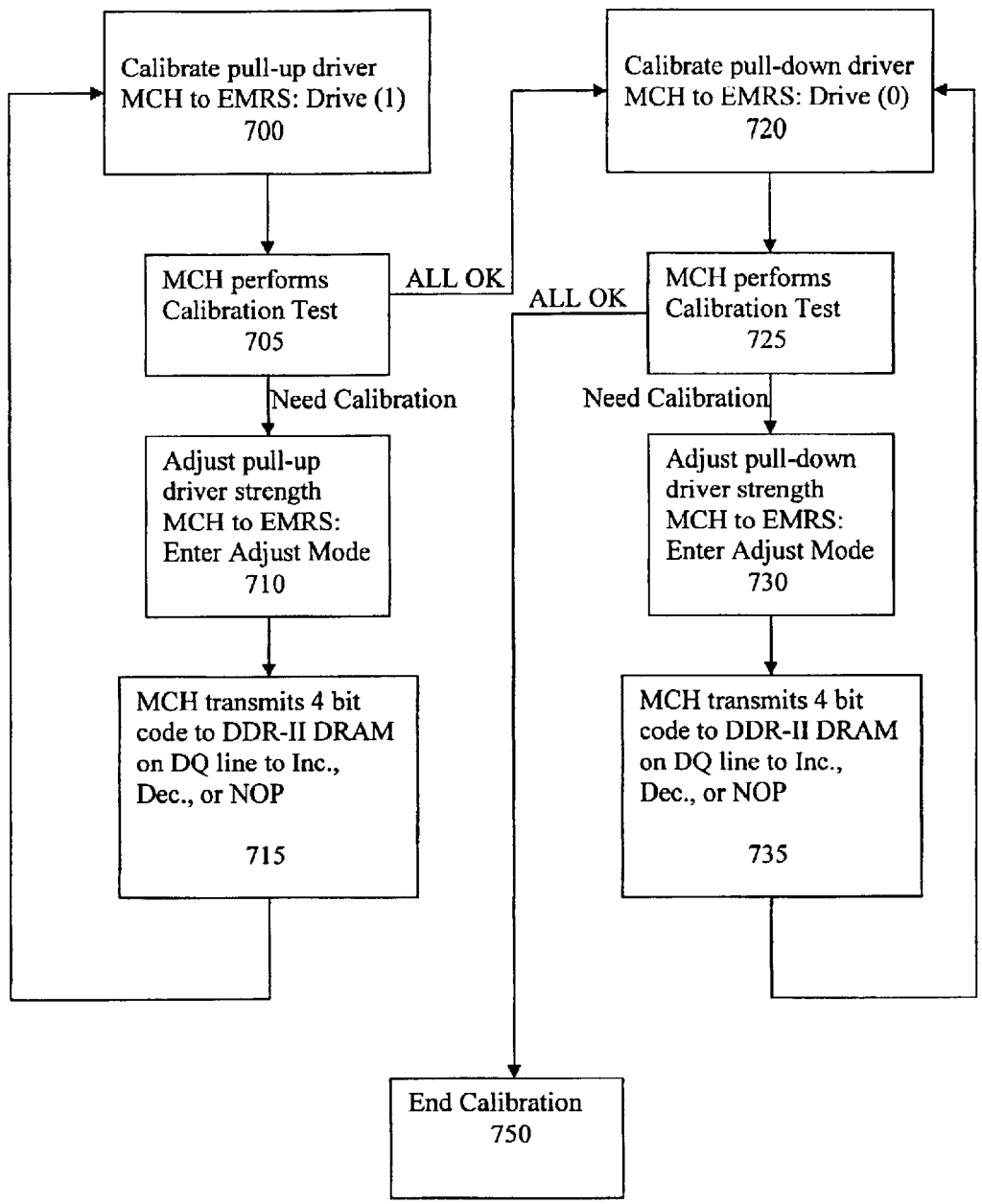
FIG. 7 illustrates a flow chart diagram for the OCD mode impedance adjustment according to an embodiment of the present invention.

FIG. 7 illustrates a flow chart diagram of the protocol for the OCD mode according to an embodiment of the present invention. For illustrative purposes only, the OCD calibration protocol will be described with reference to calibrating the P driver 410 first using the resistive divider as shown in FIG. 3B for calibrating the P driver 410 where the resistor values are equal to RonP 391, Rstub 392, and Rt 393, followed by calibrating the N driver 420 using the resistive divider as shown in FIG. 3B for calibrating the N driver 420 where the resistor values are equal to RonN 394, Rstub 392, and Rt 393. This may help the reader understand the basic concept of the OCD protocol, however, this is not the preferred method of calibration.

The pull-up or pull-down drive strength will default to a minimum drive strength, i.e., decrement the register strength to a minimum in order to increment the drive strength up to find a pass/fail point (alternatively you could default to a maximum drive strength, i.e. increment the register strength to a maximum in order to decrement down to find a pass/fail point).

Assuming a default to minimum drive strength, to calibrate the pull-up driver 410 the MCH 360 transmits a 3 bit code 001 to the EMRS (see FIG. 5) in the DDR-II SDRAM 400 to drive outputs high 700 on the DQ lines 390. The MCH 360 receives the DQ (1) and performs a calibration test 705. The DQ(1) represents a voltage at Vn 340 which is compared to VrefHi 352. If Vn 340 is greater than or equal to VrefHi 352, a pass point has been reached, ALL OK, (this will not be the case for the first calibration run), i.e., the Ron resistance 410A for the pull-up driver 410 is properly calibrated. The pull-down driver 420 may now be calibrated in step 720.

However, if Vn 340 is not greater than or equal to VrefHi 352, calibration is needed (this will be the case for the first calibration run). The MCH 360 will send a bit sequence of 100 to the EMRS in the DDR-II SDRAM 400 to instruct the SDRAM 400 to enter the Adjust impedance mode 710. The MCH 360 will then transmit 715 a 4 bit burst code 0001 to a DDR-II SDRAM 400 using a data line DQ 390 to increase the pull-up driver strength by one step (turn on one additional pull-up driver leg). The calibration procedure then returns to step 700.

Calibration steps 700, 705, 710, 715 are repeated until a pass condition, ALL OK, is met in step 705 (comparator 350 toggles), the pull-up driver 410 then being calibrated.

Similarly, the pull-down driver 420 is calibrated in steps 720, 725, 730, 735 until calibration ends 750. The pull-down driver 420 is calibrated against the VrefLo voltage 351. To calibrate the pull-down driver 420 the MCH 360 transmits a 3 bit code 010 to the EMRS (see FIG. 5) in the DDR-II SDRAM 400 to drive outputs low 720 on the DQ lines 390. The MCH 360 receives the DQ (0) and performs a calibration test 725. The DQ(0) represents a voltage at Vn 340 which is compared to VrefLo 351. If Vn 340 is less than or equal to VrefLo 351, a pass point is reached, ALL OK (this will not be the case for the first calibration run), i.e., the Ron resistance 420A for the pull-down driver 420 is properly calibrated. The calibration ends 750.

However, if Vn 340 is not less than or equal to VrefLo 351, calibration is needed (this will be the case for the first calibration run). The MCH 360 will send a bit sequence of 100 to the EMRS in the DDR-II SDRAM 400 to instruct the SDRAM 400 to enter the Adjust impedance mode 730. The MCH 360 will then transmit 735 a 4 bit burst code 0100 to the DDR-II SDRAM 400 using a data line DQ 390 to increase the pull-down driver strength by one step (turn on one additional pull-down driver leg). The calibration procedure then returns to step 720.

Calibration steps 720, 725, 730, 735 are repeated until a pass condition, ALL OK, is met in step 725 (comparator 350 toggles), the pull-down driver 420 then being calibrated.

Figure 8:
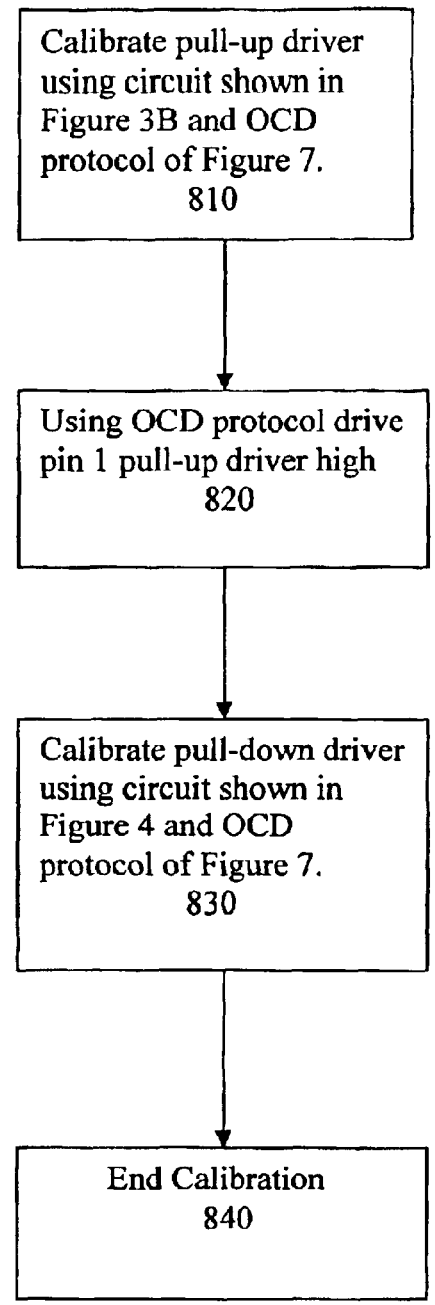
FIG. 8 illustrates a flow chart diagram for a method of calibration using the OCD mode according to an embodiment of the present invention.

FIG. 8 illustrates a flow chart diagram of the preferred calibration procedure using the circuits shown in FIG. 3B and FIG. 4, and using the steps of the OCD protocol described above and in FIG. 7. Assume the pull-up or pull-down drive strength will default to a minimum drive strength, i.e., decrement the register strength to a minimum in order to increment the drive strength up to find a pass/fail point. The calibration of the pull-up driver 410 is conducted first 810 with reference to FIG. 3B. This circuit reduces the error demonstrated in FIG. 3A by allowing VrefHi to track VTT. It will be appreciated that several methods are known in the art to calibrate the N or P device first, e.g. the absolute Ron resistance may be factory preset to approximately 18 ohms.

Referring to FIG. 7, to calibrate the pull-up driver 410 the MCH 360 transmits a 3 bit code 001 to the EMRS in the DDR-II SDRAM 400 to drive outputs high 700 on the DQ lines 390. The MCH 360 receives the DQ(1) and performs a calibration test 705. The circuit shown in FIG. 3B is used for the calibration test 705. The DQ(1) represents a voltage at Vn 340 which is compared to VrefHi 352. If Vn 340 is greater than or equal to VrefHi 352, a pass point is reached, ALL OK, i.e., the Ron resistance 410A for the pull-up driver 410 is properly calibrated (this will not be the case for the first calibration run). The pull-down driver 420 may now be calibrated 820 using the circuit shown in FIG. 4.

However, if Vn 340 is not greater than or equal to VrefHi 352, calibration is needed. The MCH 360 will send a bit sequence of 100 to the EMRS in the DDR-II SDRAM 400 to instruct the SDRAM 400 to enter the Adjust impedance mode 710. The MCH 360 will then transmit 715 a 4 bit burst code 0001 to the DDR-II SDRAM 400 using a data line DQ 390 to increase the pull-up driver strength by one step (turn on one additional pull-up driver leg). The calibration procedure then returns to step 700.

Calibration steps 700, 705, 710, 715 are repeated until a pass condition, ALL OK, is met in step 705 (comparator 350 toggles), the pull-up driver 410 then being calibrated.

The pull-down driver 420 may now be calibrated using the circuit shown in FIG. 4. After the pull-up driver 410 is calibrated 810, the MCH 360 signals the SDRAM 400 using the DDR-II OCD mode, the previously calibrated pull-up driver 410 is driven high 820 (e.g. pullup driver 410 for pin 1 372 of the SDRAM 400). The pull-down driver 420 is then calibrated 830 using steps 720, 725, 730, 735 until calibration ends 750 (see FIG. 7). The key step being the calibration test 725 using the circuit shown in FIG. 4.

The pull-down driver 420 on the adjacent pin 2 382 is driven low 720 (e.g., pulldown driver 420 for pin 2 382 of the DRAM 400). The high side signal (P-channel driver 410 on) is shorted to the low side signal (N-channel driver 420 on) via the CMOS P-channel/N-channel transistors switches (430, 433) and resistor bridge (431, 432). The resistor bridge voltage (Vcompare 451) is compared 725 to Vref 452 and the "un-calibrated" side (the legs of the N-channel driver 420) are incremented 730, 735 (assuming a default to a minimum drive strength). The MCH 360 repeats the calibration test 725 until the comparator 450 toggles.

At this point, the P side driver Ron 410A is matched to the N side driver Ron 420A within 1 LSB and the drivers 410, 420 are driving at the specification condition (i.e., approximately 0.3 volts from the supply rails) and the calibration ends 830.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of calibrating a Double Data Rate Synchronous Dynamic Random Access Memory (DDR SDRAM) pull-up driver on resistance to a pull-down driver on resistance, comprising:
   measuring a first on resistance (Ron1) of a first driver of a DDR SDRAM using a first calibration circuit;
   calibrating by adjusting the Ron1 of the first driver using a first calibration signal transmitted by a memory controller to form a calibrated first driver for driving a signal onto a transmission line;
   measuring a second on resistance (Ron2) of a second driver of the DDR SDRAM using a second calibration circuit; and
   calibrating by adjusting the Ron2 of the second driver to match the Ron1 of the calibrated first driver, using a second calibration signal transmitted by the memory controller.

2. The method according to claim 1, wherein adjusting the Ron1 of the first driver includes driving on or off a plurality of drivers connected in parallel with the first driver, and adjusting the Ron2 of the second driver includes driving on or off a plurality of drivers connected in parallel with the second driver.

3. The method according to claim 1, wherein the first calibration circuit and the second calibration circuit are contained in the memory controller.

4. The method according to claim 1, wherein the first calibration circuit includes a first comparator that compares a first drive signal generated by the first driver to a first reference voltage, and a second comparator that compares a second drive signal generated by the second driver to a second reference voltage.

5. The method according to claim 4, wherein the first reference voltage is generated by a first resistive voltage divider, and the second reference voltage is generated by a second resistive voltage divider.

6. The method according to claim 5, wherein the first resistive voltage divider includes a first plurality of resistors connected between a first voltage source and a second voltage source, and the second resistive voltage divider includes a second plurality of resistors connected between a first voltage source and a second voltage source.

7. The method according to claim 6, wherein the second calibration circuit includes a comparator that compares a comparison bridge voltage with a reference voltage equal to one half of a supply voltage VDDQ.

8. The method according to claim 7, wherein the comparison bridge voltage is a voltage at a first node generated by a pull-up drive circuit and a pull-down drive circuit.

9. The method according to claim 8, wherein the pull-up drive circuit and the pull-down drive circuit are located on adjacent pins of the DOR SDRAM.

10. The method according to claim 9, wherein the pull-up drive circuit includes a plurality of parallel P-channel pull-up drivers, and the pull-down drive circuit includes a plurality of parallel N-channel pull-down drivers.

11. The method according to claim 10, wherein the second calibration circuit includes a first resistive bridge switch, a first bridge resistor, a second resistive bridge switch, and a second bridge resistor, the on resistance of the first resistive bridge switch equals the on resistance of the second resistive bridge switch, and the resistance of the first bridge resistor equals the resistance of the second bridge resistor.

12. The method according to claim 11, wherein when the Ron2 of the second driver is matched to the Ron1 of the calibrated first driver, the resistance of the pull-up drive circuit is matched to the resistance of the pull-down drive circuit, and the comparison bridge voltage equals one half of the supply voltage VDDQ.

13. A calibration circuit for calibrating a Double Data Rate Synchronous Dynamic Random Access Memory (DDR SDRAM) pull-up driver on resistance to a pull-down driver on resistance, comprising:
    a memory controllers;
    a pull-up drive circuit for driving a signal onto a transmission line;
    a pull-down drive circuit;
    a resistive bridge circuit; and
    a comparator, wherein the pull-up drive circuit and the pull-down drive circuit are connected to the resistive bridge circuit, the comparator compares a comparison resistive bridge voltage with a reference voltage, and the memory controller adjusts a pull-down drive strength or a pull-up drive strength until they are approximately equal toggling the comparator output.

14. The calibration circuit according to claim 13, wherein the pull-up drive circuit includes a plurality of parallel P-channel pull-up drivers, and the pull-down drive circuit includes a plurality of parallel N-channel pull-down drivers.

15. The calibration circuit according to claim 14, wherein adjusting the pull-up drive strength of the pull-up drive circuit includes driving on or off drivers of the plurality of parallel P-channel pull-up drivers, and adjusting the pull-down drive strength of the pull-down drive circuit includes driving on or off drivers of the plurality of parallel N-channel pull-down drivers.

16. The calibration circuit according to claim 15, wherein resistive bridge circuit includes a first resistive bridge switch, a first bridge resistor, a second resistive bridge switch, and a second bridge resistor, the on resistance of the first resistive bridge switch equals the on resistance of the second resistive bridge switch, and the resistance of the first bridge resistor equals the resistance of the second bridge resistor.

17. The calibration circuit according to claim 16, wherein resistive bridge circuit and the comparator are contained within the memory controller.

18. The calibration circuit according to claim 17, wherein the reference voltage is equal to one half of a supply voltage VDDQ.

19. The calibration circuit according to claim 18, wherein when the pull-down drive strength is equal to the pull-up drive strength, the Ron2 of the second driver is matched to the Ron1 of the calibrated first driver, the resistance of the pull-up drive circuit is matched to the resistance of the pull-down drive circuit, and the comparison bridge voltage equals one half of the supply voltage VDDQ.

20. A method of calibrating a Double Data Rate Synchronous Dynamic Random Access Memory (DDR SORAM) pull-up driver on resistance to a pull-down driver on resistance, comprising:
    measuring a first on resistance (Ron1) of a first driver of a DDR SDRAM using a first calibration procedure;
    calibrating by adjusting the Ron1 of the first driver using the first calibration procedure;
    measuring a second on resistance (Ron2) of a second driver of the DDR SORAM using a second calibration circuit; and
    calibrating by adjusting the Ron2 of the second driver to match the Ron1 of the calibrated first driver, using a second calibration signal transmitted by a memory controller, wherein the calibrated first driver drives a signal onto a transmission line.

21. The method according to claim 20, wherein adjusting the Ron1 of the first driver includes driving on or off a plurality of drivers connected in parallel with the first driver, and adjusting the Ron2 of the second driver includes driving on or off a plurality of drivers connected in parallel with the second driver.

22. The method according to claim 20, wherein the second calibration signal is transmitted from the memory controller to the DDR SDRAM.

23. The method according to claim 20, wherein the first calibration procedure includes using a first comparator that compares a first drive signal generated by the first driver to a first reference voltage, and a second comparator that compares a second drive signal generated by the second driver to a second reference voltage.

24. The method according to claim 23, wherein the first reference voltage is generated by a first resistive voltage divider, and the second reference voltage is generated by a second resistive voltage divider.

25. The method according to claim 24, wherein the first resistive voltage divider includes a first plurality of resistors connected between a first voltage source and a second voltage source, and the second resistive voltage divider includes a second plurality of resistors connected between a first voltage source and a second voltage source.

26. The method according to claim 20, wherein the second calibration circuit includes a comparator that compares a comparison bridge voltage with a reference voltage equal to one half of a supply voltage VDDQ.

27. The method according to claim 26, wherein the comparison bridge voltage is a voltage at a first node generated by a pull-up drive circuit and a pull-down drive circuit.

28. The method according to claim 27, wherein the pull-up drive circuit and the pull-down drive circuit are located on adjacent pins of the DDR SDRAM.

29. The method according to claim 28, wherein the pull-up drive circuit includes a plurality of parallel P-channel pull-up drivers, and the pull-down drive circuit includes a plurality of parallel N-channel pull-down drivers.

30. The method according to claim 29, wherein the second calibration circuit includes a first resistive bridge switch, a first bridge resistor, a second resistive bridge switch, and a second bridge resistor, the on resistance of the first resistive bridge switch equals the on resistance of the second resistive bridge switch, and the resistance of the first bridge resistor equals the resistance of the second bridge resistor.

31. The method according to claim 30, wherein when the Ron2 of the second driver is matched to the Ron1 of the calibrated first driver, the resistance of the pull-up drive circuit is matched to the resistance of the pull-down drive circuit, and the comparison bridge voltage equals one half of the supply voltage VDDQ.

32. A method of calibrating a Double Data Rate Synchronous Dynamic Random Access Memory (DDR SDRAM) pull-up driver on resistance to a pull-down driver on resistance, comprising:

measuring a first on resistance (Ron1) of a first driver of a DDR SDRAM using a first calibration circuit contained in the memory controller;

calibrating by adjusting the Ron1 of the first driver using a first calibration signal transmitted by a memory controller to form a calibrated first driver;

measuring a second on resistance (Ron2) of a second driver of the DDR SDRAM using a second calibration circuit contained in the memory controller; and calibrating by adjusting the Ron2 of the second driver to match the Ron1 of the calibrated first driver, using a second calibration signal transmitted by the memory controller, wherein the calibrated first driver drives a signal onto a transmission line.

33. The method according to claim 32, wherein the first calibration signal and the second calibration signal are transmitted by the memory controller to the DDRSDRAM.

34. The method according to claim 32, wherein adjusting the Ron1 of the first driver includes driving on or off a plurality of drivers connected in parallel with the first driver, and adjusting the Ron2 of the second driver includes driving on or off a plurality of drivers connected in parallel with the second driver.

35. The method according to claim 32, wherein the first calibration signal and the second calibration signal are transmitted from the memory controller to the DDR SDRAM.

36. The method according to claim 32, wherein the first calibration circuit includes a first comparator that compares a first drive signal generated by the first driver to a first reference voltage, and a second comparator that compares a second drive signal generated by the second driver to a second reference voltage.

37. The method according to claim 36, wherein the first reference voltage is generated by a first resistive voltage divider, and the second reference voltage is generated by a second resistive voltage divider.

38. The method according to claim 37, wherein the first resistive voltage divider includes a first plurality of resistors connected between a first voltage source and a second voltage source, and the second resistive voltage divider includes a second plurality of resistors connected between a first voltage source and a second voltage source.

39. The method according to claim 32, wherein the second calibration circuit includes a comparator that compares a comparison bridge voltage with a reference voltage equal to one half of a supply voltage VDDQ.

40. The method according to claim 39, wherein the comparison bridge voltage is a voltage at a first node generated by a pull-up drive circuit and a pull-down drive circuit.

41. The method according to claim 40, wherein the pull-up drive circuit and the pull-down drive circuit are located on adjacent pins of the DDR SDRAM.

42. The method according to claim 41, wherein the pull-up drive circuit includes a plurality of parallel P-channel pull-up drivers, and the pull-down drive circuit includes a plurality of parallel N-channel pull-down drivers.

43. The method according to claim 42, wherein the second calibration circuit includes a first resistive bridge switch, a first bridge resistor, a second resistive bridge switch, and a second bridge resistor, the on resistance of the first resistive bridge switch equals the on resistance of the second resistive bridge switch, and the resistance of the first bridge resistor equals the resistance of the second bridge resistor.

44. The method according to claim 43, wherein when the Ron2 of the second driver is matched to the Ron1 of the calibrated first driver, the resistance of the pull-up drive circuit is matched, to the resistance of the pull-down drive circuit, and the comparison bridge voltage equals one half of the supply voltage VDDQ.

* * * * *